United States Patent
Kobayashi et al.

(10) Patent No.: US 7,411,242 B2
(45) Date of Patent: Aug. 12, 2008

(54) MINIATURIZED VIRTUAL GROUNDING NONVOLATILE SEMICONDUCTOR MEMORY DEVICE AND MANUFACTURING METHOD THEREOF

(75) Inventors: Takashi Kobayashi, Tokorozawa (JP);
Yoshitaka Sasago, Kokubunji (JP);
Tsuyoshi Arigane, Tachikawa (JP);
Yoshihiro Ikeda, Takarazuka (JP); Kenji Kanamitsu, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 292 days.

(21) Appl. No.: 11/239,338

(22) Filed: Sep. 30, 2005

(65) Prior Publication Data

US 2006/0022259 A1 Feb. 2, 2006

Related U.S. Application Data

(63) Continuation of application No. 10/718,563, filed on Nov. 24, 2003, now abandoned.

(30) Foreign Application Priority Data

Nov. 28, 2002 (JP) ............................ P2002-345456

(51) Int. Cl.
*H01L 29/76* (2006.01)
(52) U.S. Cl. .................... 257/314; 257/321; 365/185.01
(58) Field of Classification Search ................. 257/296, 257/298, 314, 315, 319, 321, 345; 365/185.01, 365/185.05, 185.06, 185.1, 185.17, 185.26, 365/185.27, 185.28

See application file for complete search history.

(56) References Cited

U.S. PATENT DOCUMENTS

| | | | | |
|---|---|---|---|---|
| 4,998,220 | A | 3/1991 | Eitan et al. | 365/185 |
| 6,103,573 | A | 8/2000 | Harari et al. | 438/257 |
| 6,476,440 | B1 | 11/2002 | Shin | 257/320 |
| 6,759,706 | B2 * | 7/2004 | Kobayashi | 257/314 |
| 2001/0045590 | A1 | 11/2001 | Kobayashi | 257/298 |
| 2002/0125520 | A1 | 9/2002 | Liu | |
| 2003/0103382 | A1 | 6/2003 | Kobayashi | 365/185.27 |

FOREIGN PATENT DOCUMENTS

| | | |
|---|---|---|
| JP | 2001-028428 | 1/2001 |
| JP | 2001-085541 | 3/2001 |

* cited by examiner

*Primary Examiner*—Thomas L Dickey
(74) *Attorney, Agent, or Firm*—Miles & Stockbridge P.C.

(57) ABSTRACT

The object of the present invention is to provide a new nonvolatile semiconductor memory device and its manufacturing method for the purpose of miniaturizing a virtual grounding type memory cell based on a three-layer polysilicon gate, enhancing the performance, and boosting the yield. In a memory cell according to the present invention, a floating gate's two end faces perpendicular to a word line and channel are partly placed over the top of a third gate via a dielectric film. The present invention can reduce the memory cell area of a nonvolatile semiconductor memory device, increase the operating speed, and enhances the yield.

9 Claims, 17 Drawing Sheets

GATE BIRD'S BEAK
WITHOUT SIDEWALL

WITH SIDEWALL 109a 110a 115b 116a

PRIOR ART

FIG. 16(a-2)

MINIATURIZED VIRTUAL GROUNDING NONVOLATILE SEMICONDUCTOR MEMORY DEVICE AND MANUFACTURING METHOD THEREOF

CROSS-REFERENCE TO RELATED APPLICATION

This application is a continuation of application Ser. No. 10/718,563 filed Nov. 24, 2003 now abandoned.

BACKGROUND OF THE INVENTION

1. Field of the Invention

The present invention relates to a nonvolatile semiconductor memory device and its manufacturing method, and more particularly to a method for enhancing the performance, increasing the degree of integration, and improving the yield.

2. Description of the Related Art

Flash memories excel in portability and shock resistance. Further, they can be electrically erased at a time. In recent years, therefore, they have been increasingly demanded as a filing device for use with mobile personal computers, digital still cameras, video cameras, and other small-size, portable information devices. Reducing the bit cost by decreasing the memory cell region and enhancing the programming speed for supporting a quick content download are essential for flash memory market expansion. Some memory cell methods for achieving such a purpose are now proposed. For example, a virtual grounding type memory cell based on a three-layer polysilicon gate is disclosed (refer to JP-A No. 028428/2001 or JP-A No. 085541/2001). As shown in FIG. 15, this memory cell comprises a floating gate 204, which serves as a first gate, a control gate 205, which serves as a second gate, and a third gate 206. The memory cell comprises a well 202 in a silicon substrate 201, a source in the well, drain diffusion layer regions 203, 203', and a first gate composed of polysilicon film formed on the well. The third gate incorporates the functionality of either an erase gate or a split channel control gate. Dielectric films 207, 208, 209, 210, 211 are used to separate polysilicon gates 204, 205, 206 and separate the well 202 from the polysilicon gates. The control gate 205 is connected in the row direction to constitute a word line. The source and drain diffusion layer regions 203, 203' are of a virtual grounding type, which shares an adjacent memory cell diffusion layer. This reduces the pitch in the row direction. The third gate 206 is perpendicular to a channel and positioned perpendicularly to the word line 205. When a programming operation is to be performed, an independent positive voltage is applied to the word line 205, drain 203, and third gate 206, and the well 202 and source 203' are set at 0 V. Hot electrons are then generated on a channel at a boundary between the third gate and floating gate and introduced into the floating gate 204. This results in an increase in the memory cell threshold voltage. When an erasing operation is to be performed, a positive voltage is applied to the third gate 206, and a negative voltage is applied to the word line 205. The source 203', drain 203, and well 202 are set at 0 V. Electrons are then emitted from the floating gate 204 to the third gate 206 so that the threshold voltage decreases. A negative voltage is applied to the word line 205. The third gate 206, source 203', drain 203, and well 202 are set at 0 V. Electrons are then emitted from the floating gate 204 to the well 202 so that the threshold voltage decreases. The memory cell transistor threshold voltage is varied in this manner to distinguish between the information values "0" and "1".

However, new tasks arise when an attempt is made to increase the capacity of the above nonvolatile semiconductor memory device.

The first task is to decrease the internal operating voltage for programming or erasing a memory cell. This task is particularly evident when an attempt is made to erase a memory cell. As regards a flash memory, the following equation generally expresses the relationship between the control gate voltage Vcg and floating gate Vfg:

$$Vfg = Vcg \times C2/(C1+C2+Cag+Cfg) \quad \text{Equation (1)}$$

where C1 is the capacity of dielectric film (tunnel dielectric film) between the floating gate and the Si substrate, C2 is the capacity of dielectric film (interpoly dielectrics) between the floating gate and the control gate, Cag is the capacity of dielectric film between the floating gate and the third gate, and Cfg is the capacity of dielectric film between floating gates under an adjacent word line. The value C2/(C1+C2+Cag+Cfg) is called a coupling ratio. To ensure that a voltage applied to the control gate is efficiently transmitted to the floating gate for the purpose of performing a programming/erasing operation, it is essential that the coupling ratio be increased. To achieve this purpose, it is important to (1) increase the capacity of interpoly dielectrics C2, (2) reduce Cag by increasing the thickness of film between the third gate and floating gate, and (3) provide the floating gate with a U- or fin-shaped cross section in order to reduce the cross-sectional area of the floating gate and decrease the capacity of dielectric film Cfg between opposing floating gates. To increase C2, it is necessary to increase the floating gate surface area. In the above publicly known example, however, it is difficult to decrease the operating voltage because the floating gate 204 has a small surface area. This problem is particularly crucial for an erasing operation that is performed by applying a high voltage to the dielectric film 210 between the floating gate and Si substrate and emitting electrons accumulated in the floating gate toward the substrate due to tunneling. For a multilevel flash memory, which stores two bits of data per memory cell, the memory cell threshold voltage difference between the programming state and erasing state needs to be great. It is essential that the coupling ratio be improved to reduce the programming/erasing time.

The second task is to reduce deviation programming speed distribution and miniaturize the third gate. Various methods for forming a virtual grounding type memory cell with a three-layer polysilicon gate are stated in JP-A No. 085541/2001. In a certain method stated in JP-A No. 085541/2001, which forms a floating gate 204 after forming a third gate 206, a gate bird's beak is generated. More specifically, the lower end of the third gate 206, which is formed earlier, is oxidized when a tunnel dielectric film 210 is formed by means of thermal oxidation, so that the gate oxide film thickness increases.

The reason is that the gate oxide film for the lower end of the third gate is removed in a cleaning process for tunnel dielectric film formation. As a result, the lower end of the third gate polysilicon film is oxidized. The growth of the gate bird's beak varies the threshold voltage of a MOS transistor, which is formed by the third gate, so that deviation of programming distribution of memory cell increase. The increase in the memory cell programming speed deviation causes an increase in the number of verifications for judging whether a specified threshold level is reached by a multilevel flash memory. This results in an increase in the chip programming time. Further, when the gate oxide film thickness of the third gate increases due to the growth of the gate bird's beak, the punch-through immunity of the MOS transistor formed by the third gate decreases, making it difficult to reduce the gate length.

The third task is to miniaturize the word line. For high-density flash memories, the word line is generally patterned to the minimum dimensions for memory cell miniaturization. To achieve this purpose, it is necessary to provide an adequate focus margin in a lithography process for word line patterning. Consequently, the third task is to minimize the step coverage.

As described above, the development of a new nonvolatile semiconductor memory device and its manufacturing method has been called for in order to miniaturize a virtual grounding type memory cell based on a three-layer polysilicon gate and accomplish the tasks for performance enhancement.

SUMMARY OF THE INVENTION

It is an object of the present invention to provide a new nonvolatile semiconductor memory device and its manufacturing method for the purpose of miniaturizing a virtual grounding type memory cell based on a three-layer polysilicon gate, enhancing the performance, and improving the yield.

A typical example of the present invention will now be briefly described.

A nonvolatile semiconductor memory device according to the present invention comprises a memory cell, which includes a first conductive well, which is formed in a silicon substrate; a second conductive source/drain region, which is formed in the well; a channel formed perpendicularly to the source/drain region; a floating gate, which is the first gate formed on the silicon substrate via a dielectric film; a control gate, which is the second gate formed above the floating gate via dielectric film; a word line formed with the control gate connected; and a third gate, which is formed above silicon substrate, beside floating gate, and below control gate via a dielectric film and exercises functions different from those of the floating gate and control gate. To achieve the above object, the floating gate's two ends that are positioned perpendicularly to the word line are placed over the top of the third gate via the dielectric film.

The above floating gate is positioned in a gap in the third gate in such a manner that the gap is not completely filled.

When the sidewall within the third gate space is A, the bottom within the third gate space is B, the flat section on the top of the third gate is C, and the sidewall on the top of the third gate is D, the surface area of the above floating gate is as follows:

$$A > B + C + D$$

The above third gate provides split channel control gate. Alternatively, the above third gate exercises the functions of both an erase gate and split channel control gate. It is preferable that the dielectric film between the above third gate and well should be identical with the gate dielectric film for a peripheral circuit low-voltage section. It is also preferable that the components and film thickness of the above third gate should be the same as those of a peripheral circuit gate.

In a nonvolatile semiconductor memory device comprising a memory cell, which includes a first conductive well formed in a silicon substrate; a source/drain region formed in the well; a channel formed perpendicularly to source/drain region; a floating gate, which is the first gate formed above the silicon substrate via a dielectric film; a control gate, which is the second gate formed above the floating gate via dielectric film; a word line formed with the control gate connected; and a third gate, which is formed above silicon substrate, beside floating gate, and below control gate via a dielectric film=and exercises functions different from those of the floating gate and control gate, the above object is achieved by positioning a contact hole for connecting the word line and metal wiring on a member having the same material and film thickness as the third gate via a dielectric film. In the above instance, it is preferable that the above member should be a polysilicon film.

Further, in a nonvolatile semiconductor memory device comprising a memory cell, which includes a first conductive well formed in a silicon substrate; source/drain region formed in the well; a channel formed perpendicularly to the source/drain region; a floating gate, which is the first gate formed above the silicon substrate via a dielectric film; a control gate, which is the second gate formed above the floating gate via dielectric film; a word line formed with the control gate connected; and a third gate, which is formed above silicon substrate, beside floating gate, and below control gate via a dielectric film and exercises functions different from those of the floating gate and control gate, the above object is achieved by forming a second conductive impurity region within a silicon substrate under a plurality of third gate binds. In the above instance, the above source/drain region, the second conductive impurity region, and a diffusion layer region for a select transistor for selecting the second conductive the source/drain region are connected.

Furthermore, the above object is achieved when a method for manufacturing a nonvolatile semiconductor memory device comprising a memory cell, which includes a first conductive well formed in a silicon substrate; a source/drain region formed in the well; a channel formed perpendicularly to the source/drain region; a floating gate, which is the first gate formed above the silicon substrate via a dielectric film; a control gate, which is the second gate formed above the floating gate via dielectric film; a word line formed with the control gate connected; and a third gate, which is formed above silicon substrate, beside floating gate, and below control gate via a dielectric film and exercises functions different from those of the floating gate and control gate comprises the steps of forming a plurality of wells on a semiconductor substrate; forming on the wells a first gate dielectric film and a second gate dielectric film, which differ in film thickness; forming a first polysilicon film on the first and second gate dielectric films; patterning the first polysilicon film to form a line and space in a first direction; forming a third gate dielectric film in the space; forming a second polysilicon film; patterning the second polysilicon film in the first direction; forming interpoly dielectrics; forming a third polysilicon film; patterning the third polysilicon film and second polysilicon film in a second direction which is perpendicular to the first direction; and patterning the first polysilicon film for a second time.

In the above instance, the step of patterning the first polysilicon film to form a line and space in the first direction is performed solely by a memory cell array section. In this instance, it is preferable that the first gate dielectric film should be thicker than the third gate dielectric film.

Further, subsequently to line-and-space formation in the first direction by the above first polysilicon film, it is preferable that a third gate dielectric film should be formed after forming a dielectric film sidewall on the polysilicon film.

Furthermore, the above first polysilicon film is patterned in such a manner that a line section is bound at an end of the line and space in the first direction. In this instance, a second conductive impurity is introduced under a bind for the above first polysilicon film pattern before patterning. The patterning in the first direction for the above second polysilicon film is performed on the first polysilicon film pattern line. Alternatively, the patterning in the first direction for the above second polysilicon film may be performed in such a manner as to embed the second polysilicon film into the space for the first polysilicon film pattern.

DESCRIPTION OF THE PREFERRED EMBODIMENTS

Preferred embodiments of the present invention will be described in detail below.

First Embodiment

Figure 1:
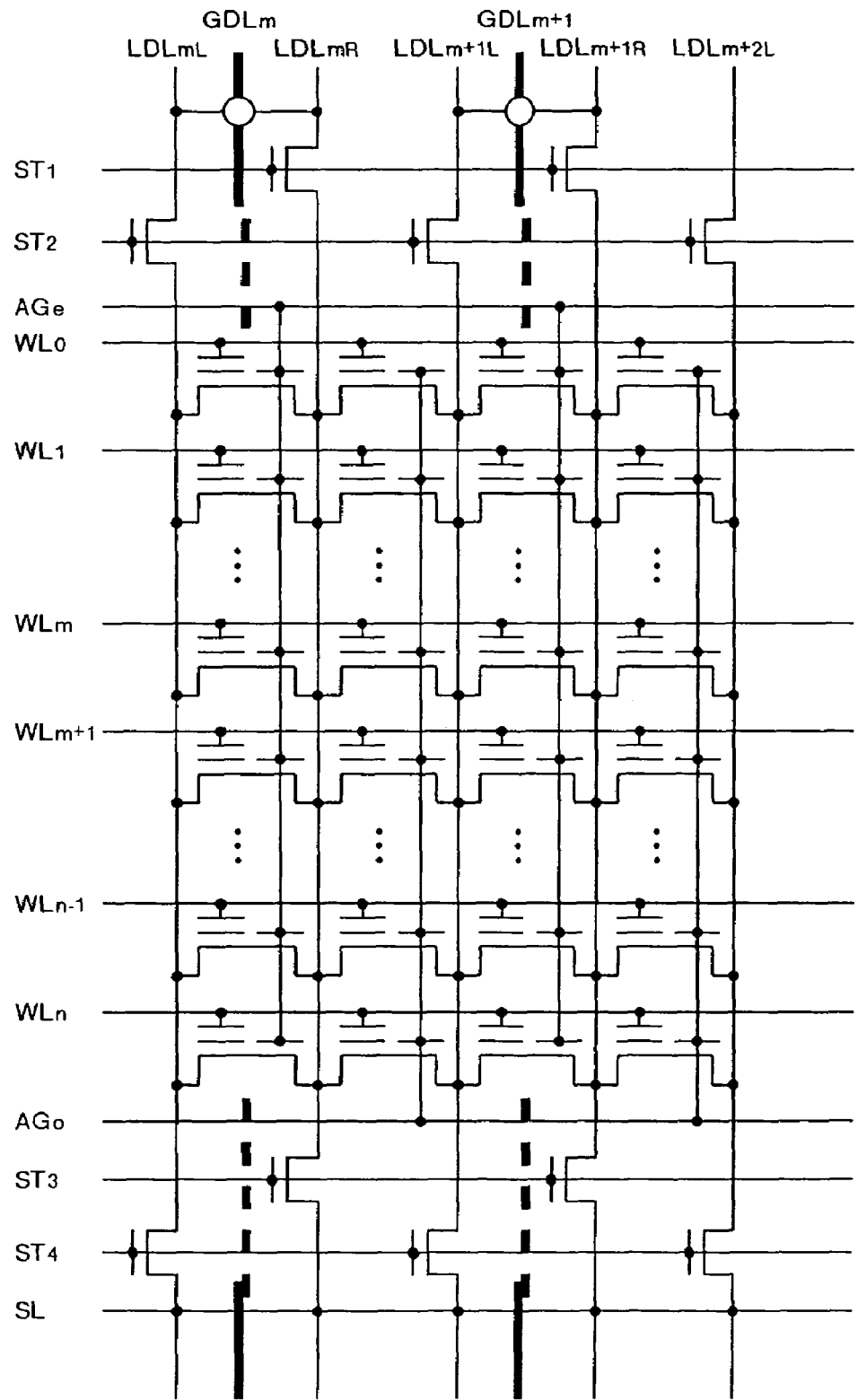
FIG. 1 is a circuit diagram that illustrates a flash memory cell array according to a first embodiment of the present invention.
Figure 2:
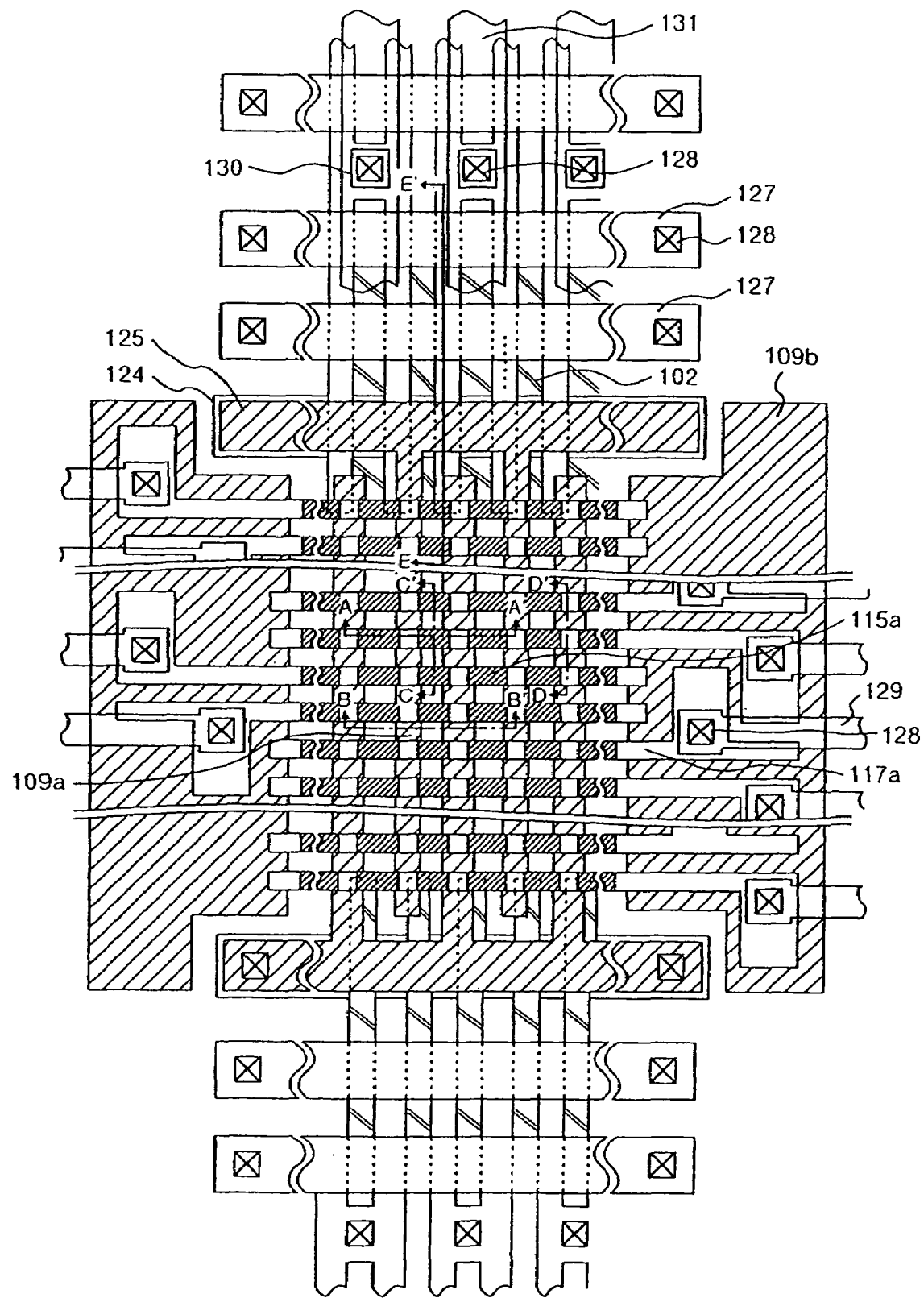
FIG. 2 is a plan view that illustrates the main parts of a flash memory according to the first embodiment of the present invention.
Figure 3A:
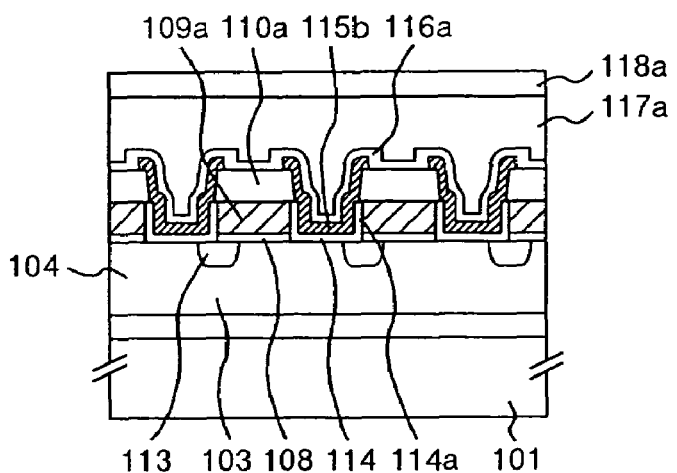
FIGS. 3(a) to 3(d) are cross-sectional views that illustrate the main parts of the flash memory.
Figure 3B:
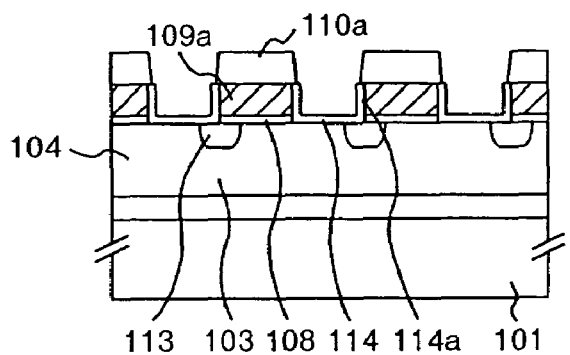
Figure 3C:
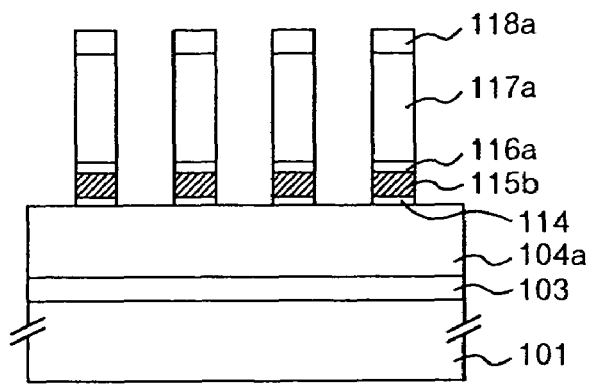
Figure 3D:
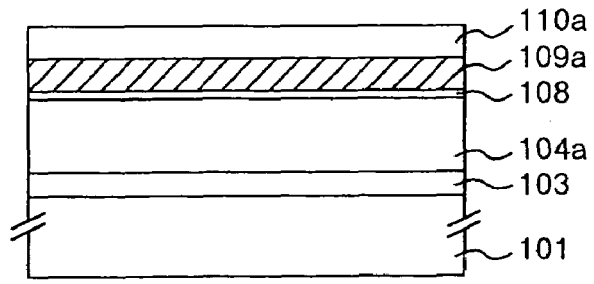
Figure 4A:
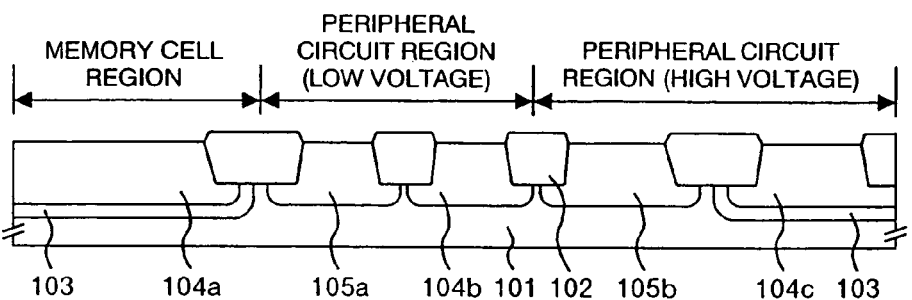
FIGS. 4(a) to 4(f) are cross-sectional views that illustrate a method for manufacturing the flash memory.
Figure 4B:
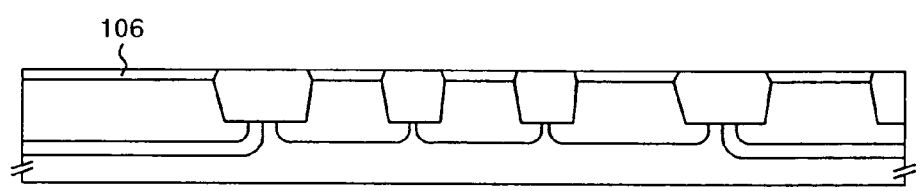
Figure 4C:
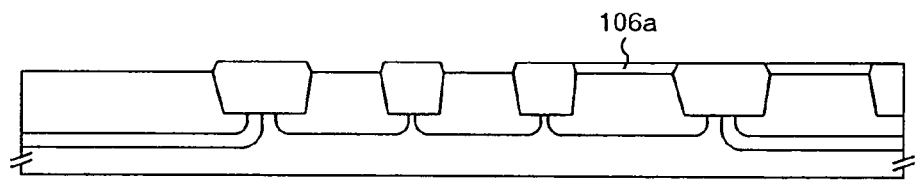
Figure 4D:
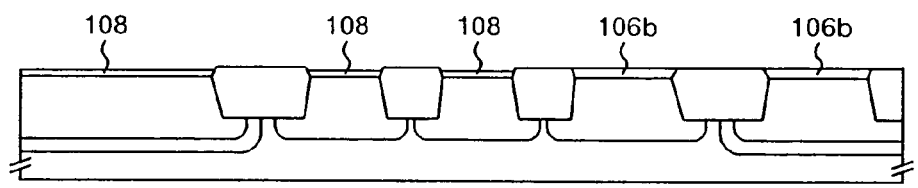
Figure 4E:
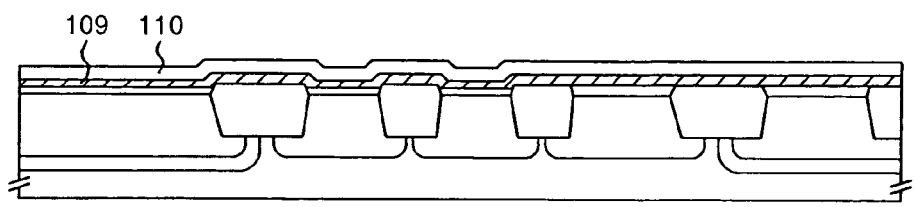
Figure 4F:
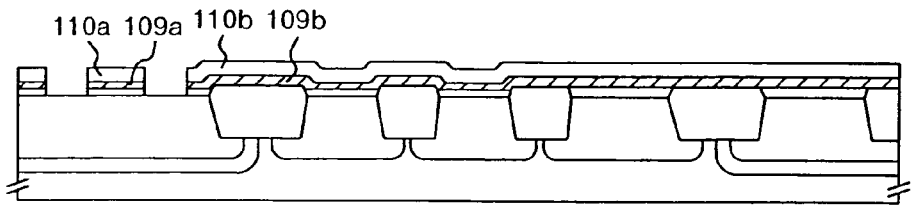

A first embodiment of the present invention will now be described with reference to FIGS. 1 to 6. FIG. 1 is a circuit diagram that illustrates a memory array in which flash memory cells are arranged in matrix form. FIG. 2 is a plan view of a memory cell array. FIGS. 3(a) to 3(d) are cross-sectional views of sections A-A', B-B', C-C', and D-D' of FIG. 2, respectively. FIGS. 4 to 6 are cross-sectional views that illustrate a process for memory cell/peripheral circuit manufacturing. FIGS. 16 to 18 illustrate a manufacturing process for cross section E-E'.

In FIG. 1, GDL denotes a global data line whereas LDL denotes a local data line. The memory cell array shown in this figure has a hierarchical data line structure. WL denotes a word line. AG denotes a third gate (assist gate). ST denotes gate wiring for a select transistor. SL denotes a common source line.

Figure 6A:
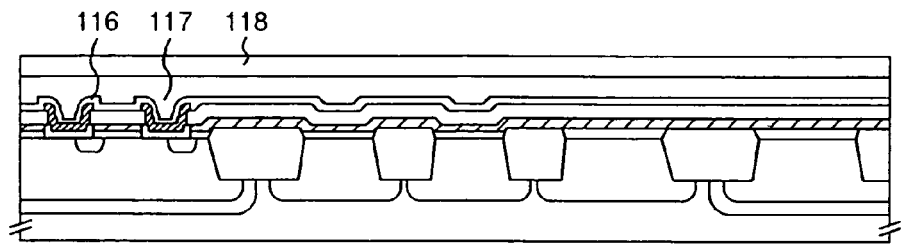
FIGS. 6(a) to 6(e) are cross-sectional views that illustrate a method for manufacturing the flash memory.
Figure 6B:
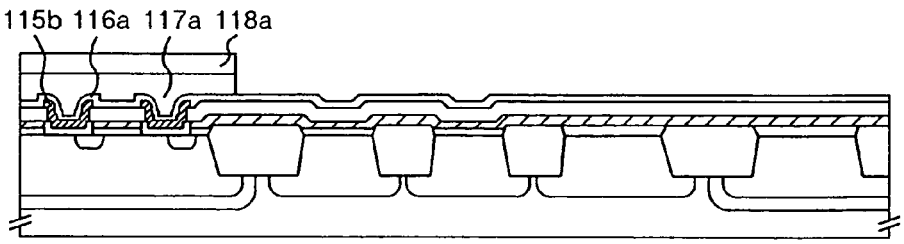
Figure 6C:
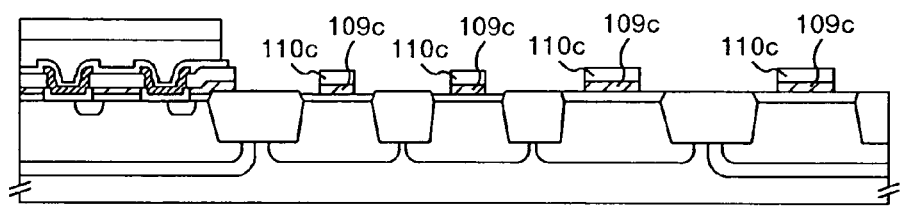
Figure 6D:
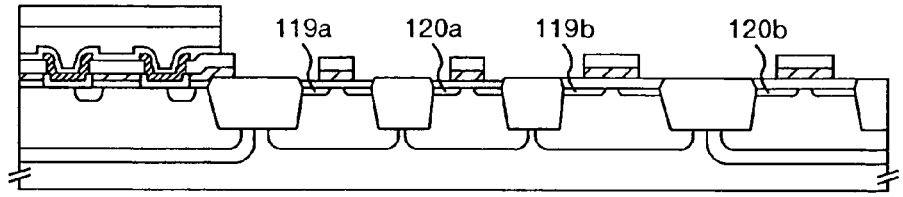
Figure 6E:
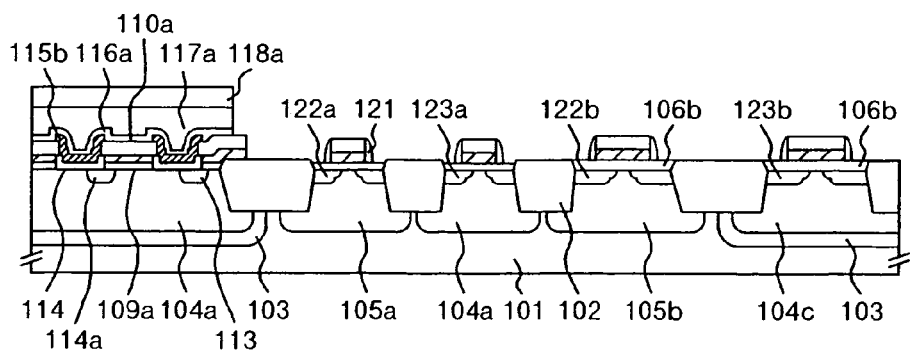

As shown in FIGS. 3 and 6(e), each memory cell comprises a source/drain diffusion layer 113, which is within a p-type well 104 formed on a silicon substrate 101; a floating gate 115b, which serves as a first gate; a control gate 117a, which serves as a second gate; and a third gate 109a. The control gates 117a of memory cells are connected in the row direction to form a word line. The floating gate 115b and well 103 are separated by gate dielectric film 114. The third gate 109a and well 103 are separated by gate dielectric film 108. The floating gate 115b and third gate 109a are separated by dielectric film 114a. The floating gate 115b and word line 117a are separated by dielectric film 116a. The third gate 109a and word line 117a are separated by dielectric film 110a. The source/drain diffusion layer 113 is positioned perpendicularly to the word line 117a and exists as a local source line and local data line for connecting the sources and drains of memory cells arranged in the column direction. In other words, the nonvolatile semiconductor memory device comprises a contactless array in which each memory cell has no contact hole. Channel formation takes place in a direction perpendicular to the diffusion layer 113.

Two end faces of the third gate 109a respectively face two end faces of the above floating gate 115b, which are perpendicular to the word line 117a and channel, respectively, via dielectric film 114a. The floating gate 115b is positioned in a gap in the third gate 109a, which is positioned perpendicular to the word line 117a and channel. Further, the floating gate 115b is symmetrical with respect to the third gate 109a, and the third gate 109a is symmetrical with respect to the floating gate 115b.

In the present embodiment, a pair of diffusion layers 113, which form a source/drain, is positioned asymmetrically with respect to the pattern of the floating gate 115b, and an offset structure is employed so that one diffusion layer does not overlap with the floating gate. The third gate 109a and diffusion layer 113 exist so that they partly overlap with each other.

A programming operation, erasing operation, and read operation will now be described with reference to FIGS. 7 to 9.

TABLE 1

|  | Programming | Erasing | Read |
|---|---|---|---|
| $WL_m$ | 13.5 V | −18 V | Vr |
| $WL_{m+1}$ | 0 V | 0 V | 0 V |
| $GDL_m$ | 4.5 V | 0 V | 1 V |
| $GDL_{m+1}$ | 4.5 V | 0 V | 1 V |
| $LDL_{mL}$ | 0 V | 0 V | 0 V |

TABLE 1-continued

| | Programming | Erasing | Read |
|---|---|---|---|
| $LDL_{mR}$ | 4.5 V | 0 V | 1 V |
| $LDL_{m+1L}$ | 0 V | 0 V | 0 V |
| $LDL_{m+1R}$ | 4.5 V | 0 V | 1 V |
| $LDL_{m+2L}$ | 0 V | 0 V | 0 V |
| $AG_e$ | 0 V | 0 V | 0 V |
| $AG_o$ | 1.1 V | 0 V | 3.5 V |
| $ST_1$ | 6 V | 0 V | 6 V |
| $ST_2$ | 0 V | 0 V | 0 V |
| $ST_3$ | 0 V | 0 V | 0 V |
| $ST_4$ | 6 V | 0 V | 6 V |

Figure 7:
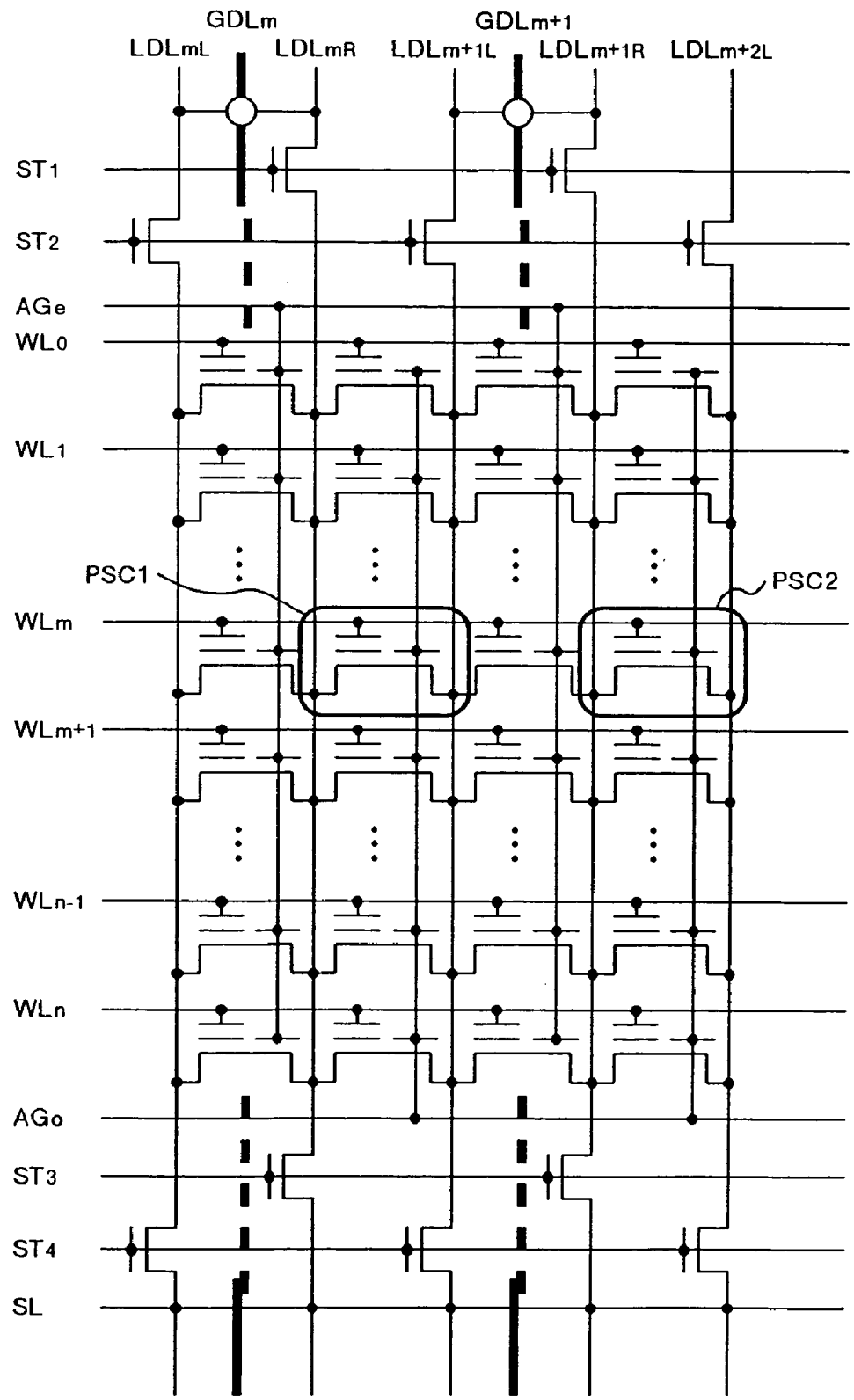
FIG. 7 is a circuit diagram that illustrates a programming operation of the flash memory.

First, when select cell PCS1 shown in FIG. 7 is to be programmed, a high, positive voltage of, for instance, 13.5 V or so is applied to word line $WL_m$ and a low voltage of approximately 1.1 V is applied to third gate $AG_o$. Further, a voltage of approximately 4.5 V is applied to global data line $GDL_m$ and red to local data line $LDL_{mF}$ via select transistor $ST_1$. Source $LDL_{m+1L}$ and p well are maintained at 0 V. Channel formation then takes place in a well under third gate 109a so that a channel at an end of a floating gate on the source side generates hot electrons. The electrons are then injected into the floating gate. In other words, third gate 109a functions as a gate that controls a channel existing underneath. The memory cells are such that the efficiency of hot electron generation and injection is higher than that of a prior art NOR flash memory. The memory cells make it possible to perform programming in a region where the channel current is small. Therefore, an internal power supply having the same current supply capacity as a flash memory chip that performs a programming operation based on tunneling can perform a parallel programming operation for a large number of memory cells on the order of kilobytes, thereby improving the programming throughput.

Figure 8:
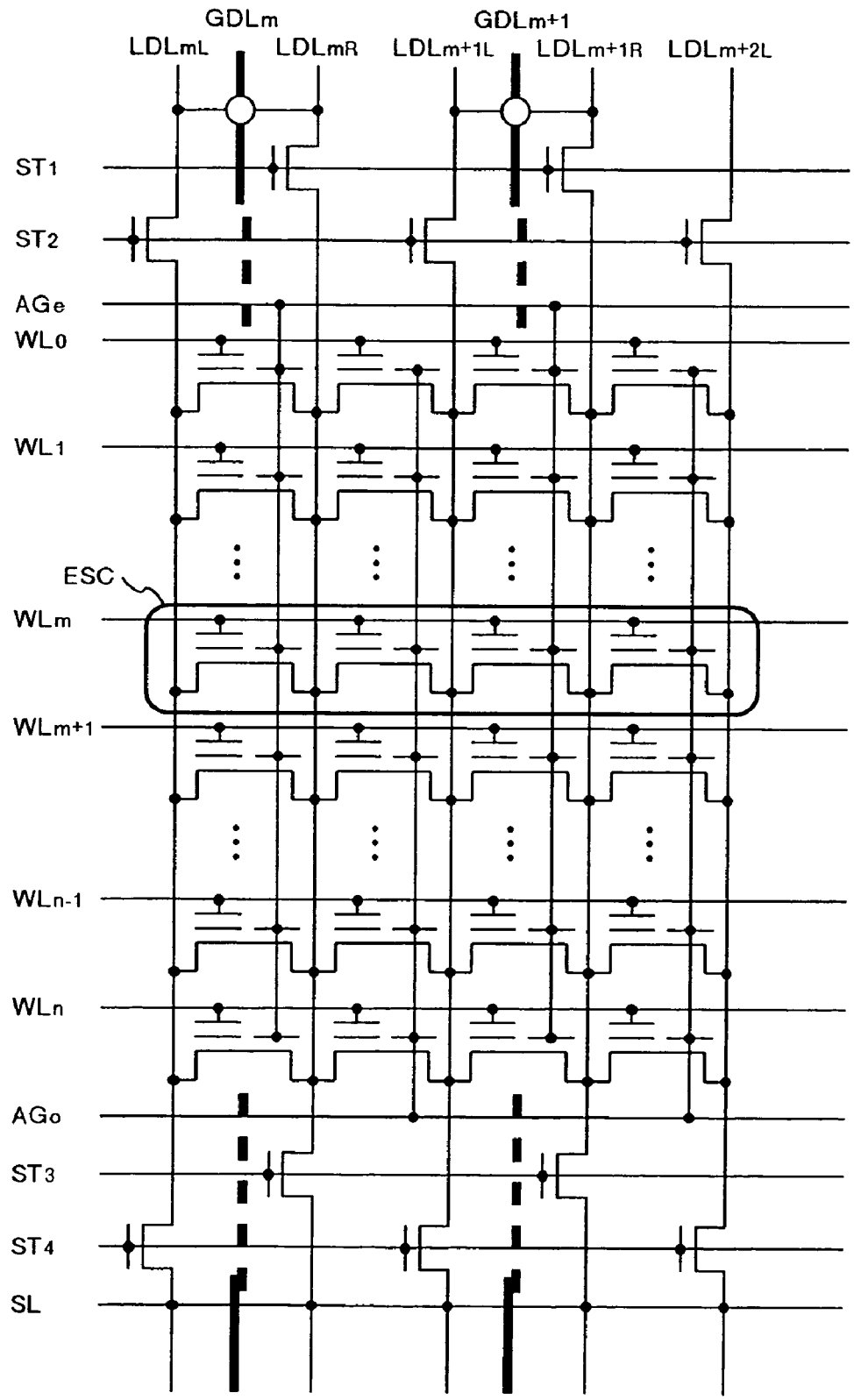
FIG. 8 is a circuit diagram that illustrates an erasing operation of the flash memory.

For an erasing operation, a high, negative voltage of, for instance, −18 V is applied to word line $WL_m$ as shown in FIG. 8. In this instance, third gate $AG_e$ and $AG_o$, all source/drain diffusion layers DL, and well are maintained at 0 V. Alternatively, a high, negative voltage of, for instance, −16 V is applied to word line $WL_m$, a positive voltage of, for instance, 2 V is applied to the well, and third gate $AG_e$ and $AG_o$ and all source/drain diffusion layers DL are maintained at 0 V. This invokes a Fowler-Nordheim tunnel current flow from the floating gate to the well, thereby allowing electrons accumulated on the floating gate to be emitted.

Figure 9:
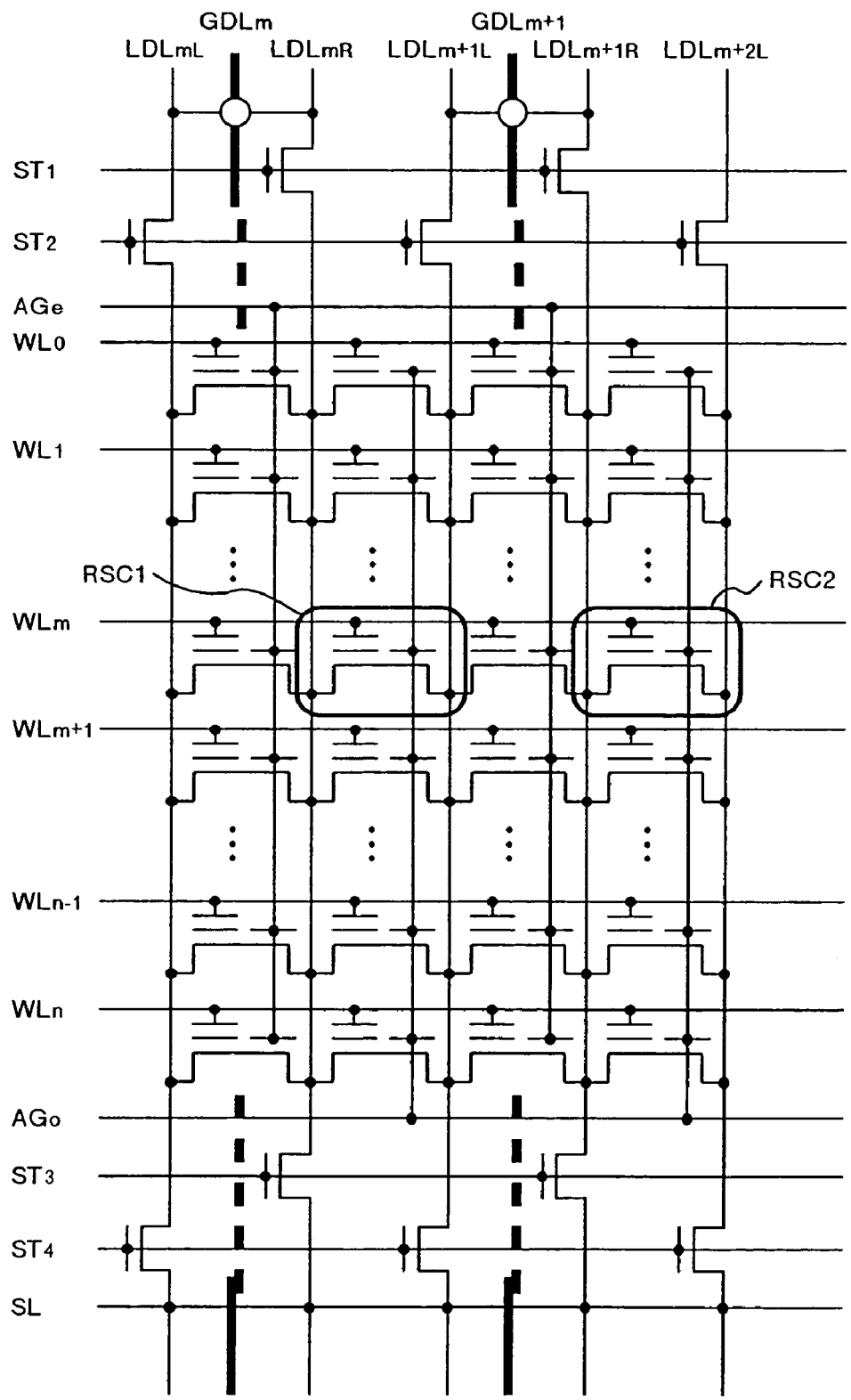
FIG. 9 is a circuit diagram that illustrates a read operation of the flash memory.

When information is to be read from cell RSC1 shown in FIG. 9, a voltage is applied to word line $WL_m$ in accordance with a multivalued threshold voltage level, and a voltage of approximately 3.5 V is applied to third gate $AG_o$. Further, a voltage of approximately 1 V is applied to global data line $GDL_m$ and fed to local data line $LDL_{mR}$ via select transistor $ST_1$. Source $LDL_{m+1L}$ and p well are maintained at 0 V.

As indicated in 3(a), the present embodiment differs from the prior art in that two end faces of the floating gate 115b that are perpendicular to the word line 117a and channel are respectively placed over the top of the third gate 109a via dielectric film 110a. The film thickness of the floating gate 115b is set so as not to completely fill the third gate space. The use of such a fin-shaped floating gate can reduce the cross-sectional area parallel to a word line, decrease the size of dielectric film between opposing floating gates between adjacent word lines, and increase the floating gate surface area. This ensures that the memory cell's coupling ratio improves to reduce the internal operating voltage for use in a programming/erasing operation even if the word line pitch decreases due to miniaturization, thereby reducing the distance between word lines. Further, since the dielectric film between opposing floating gates between adjacent word lines is small in size, it is possible to reduce the read threshold voltage discrepancy that arises depending on whether the adjacent bit threshold voltage is in a programming state or erasing state. Consequently, a multilevel memory, which stores at least two bits of data per memory cell with the threshold voltage set for four or more levels, can compress the distribution of each threshold voltage, thereby making it possible to reduce the amount of threshold voltage changes for a programming/erasing operation. As a result, the reducing the programming/erasing time, conducting a low-voltage operation, and data retention characteristics by alleviating an abandoned electric field can be improved.

Figure 14:
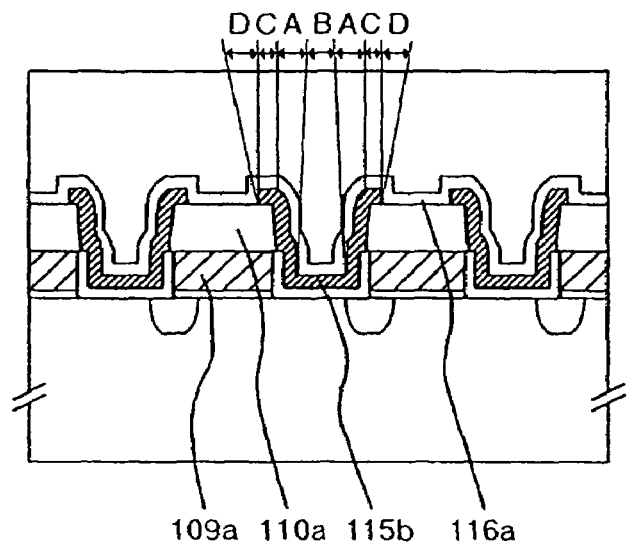
FIG. 14 shows a cross section of a flash memory cell according to the present invention.
Figure 15:
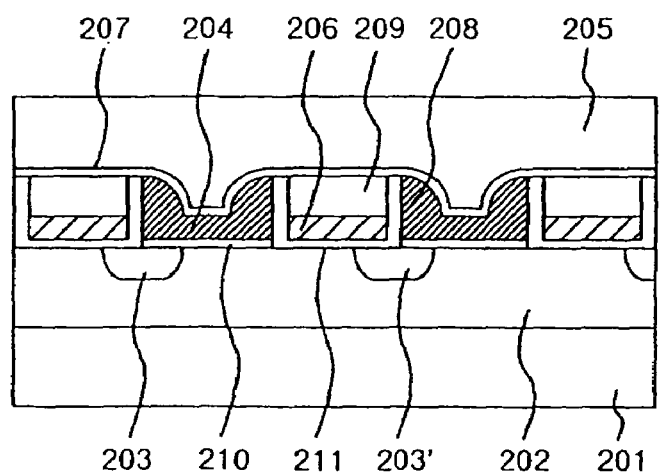
FIG. 15 shows a cross section of the major parts of a prior art flash memory.
Figure 16A:
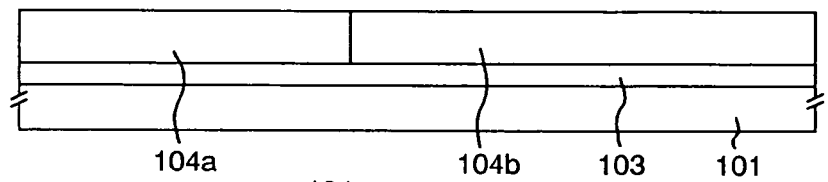
FIGS. 16(a) to 16(f) are cross-sectional views (section E-E' of FIG. 2) that illustrate a method for manufacturing a memory cell and select transistor of a flash memory according to the present invention.
Figure 16A:
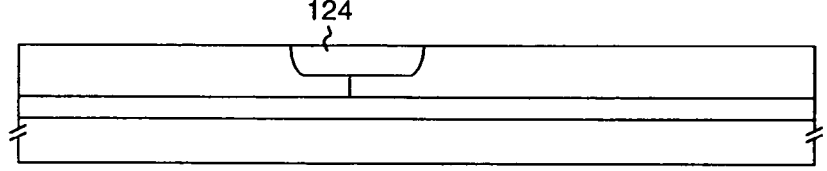
Figure 16B:
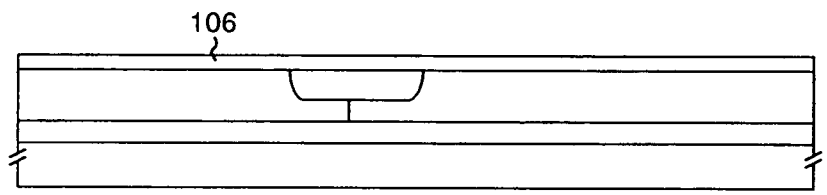
Figure 16C:
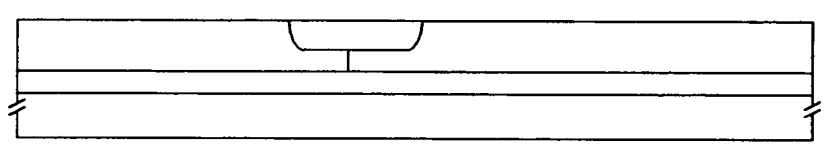
Figure 16D:
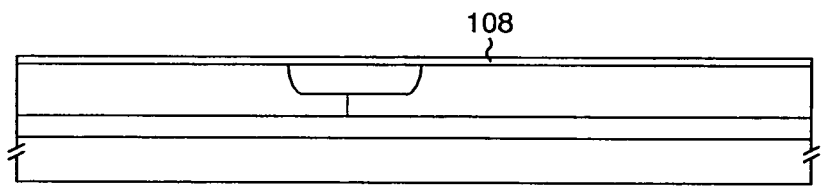
Figure 16E:
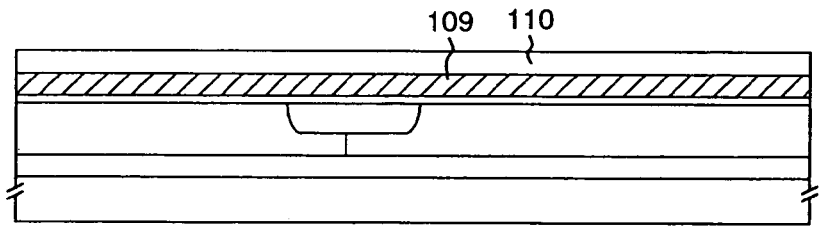
Figure 16F:
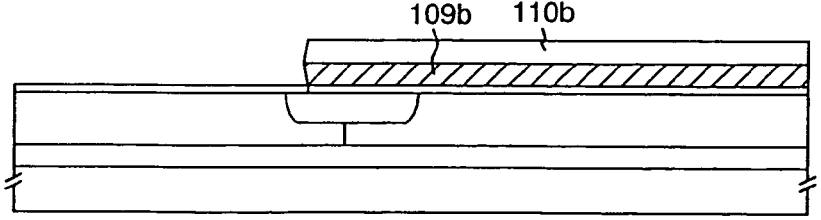
Figure 17A:
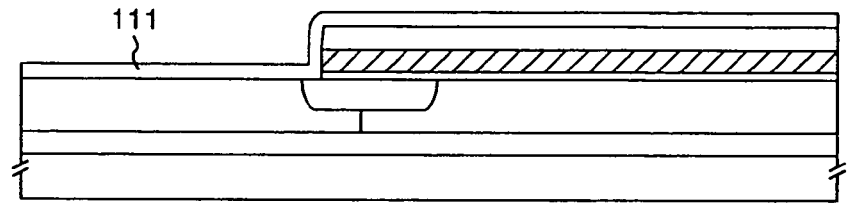
FIGS. 17(a) to 17(f) are cross-sectional views (section E-E' of FIG. 2) that illustrate a method for manufacturing a memory cell and select transistor of a flash memory according to the present invention.
Figure 17B:
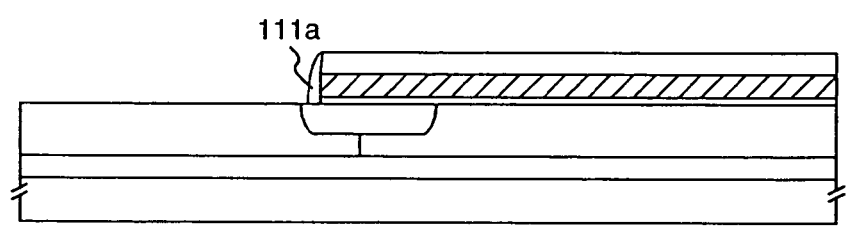
Figure 17C:
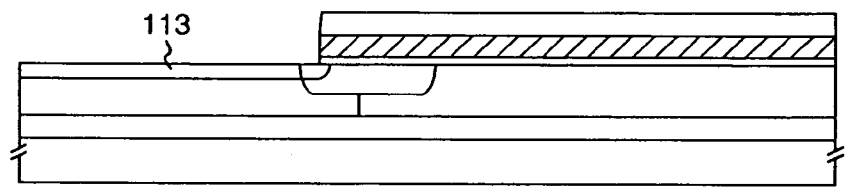
Figure 17D:
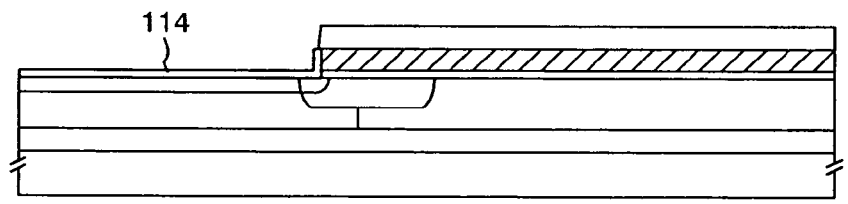
Figure 17E:
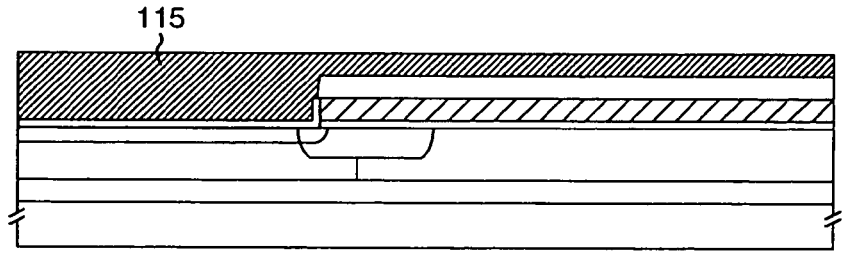
Figure 17F:
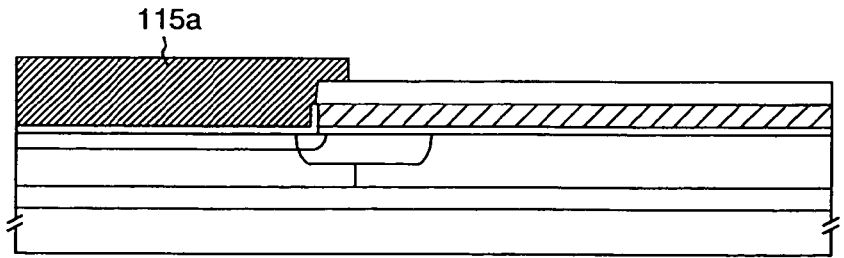
Figure 18A:
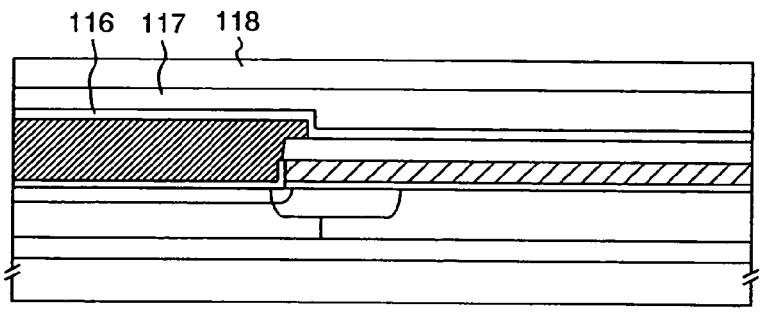
FIGS. 18(a) to 18(e) are cross-sectional views (section E-E' of FIG. 2) that illustrate a method for manufacturing a memory cell and select transistor of a flash memory according to the present invention.
Figure 18B:
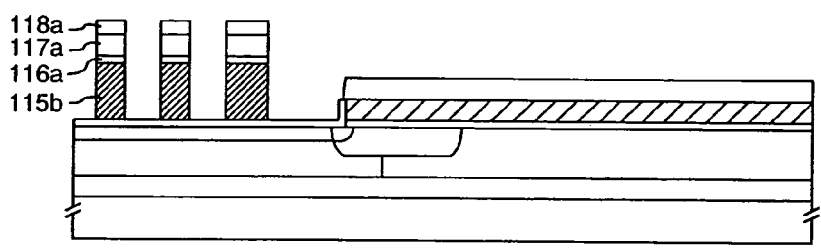
Figure 18C:
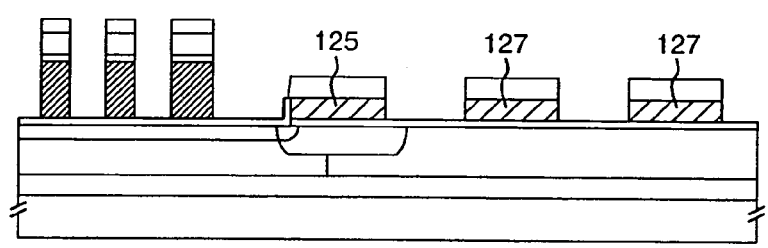
Figure 18D:
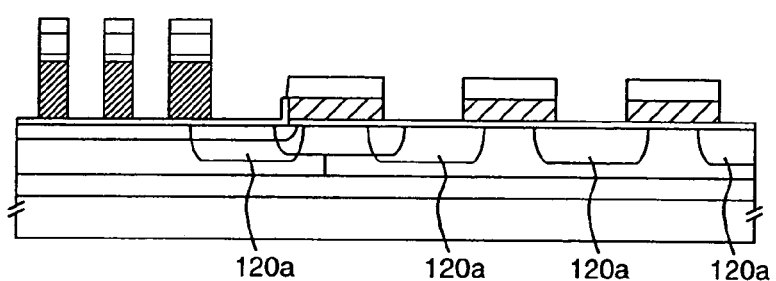
Figure 18E:
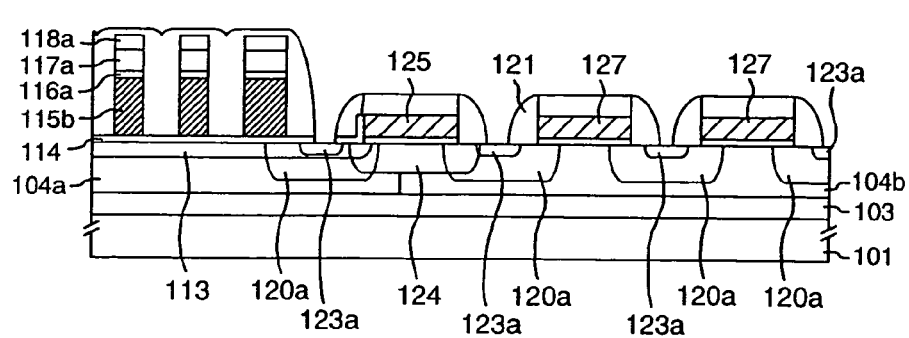

In this instance, when the surface area of the floating gate 115b within the sidewall of the third gate space is A, the surface area of the bottom section within the third gate space is B, the surface area of the flat top of the third gate is c, and the surface area of the sidewall on the top of the third gate is D as shown in FIG. 14, the following equation holds:

$$A > B + C + D \qquad \text{Equation (2)}$$

For memory cell miniaturization, the third gate line and space needs to be reduced. To increase the floating gate surface area under these conditions, it is necessary to ensure that the values B and C are small, and that the value A or D is great. An increase in the value D causes an increase in the capacity of the dielectric film between opposing floating gates between adjacent word lines. Therefore, the area relationship indicated by Equation (2) in which the sidewall area A within the third gate space is enlarged with the areas of the other sections minimized is effective for memory cell miniaturization, operating speed increase, and data storage characteristic improvement.

After third gate formation, a dielectric film sidewall is formed on the third gate before the formation of floating gate dielectric film (so-called tunnel dielectric film). This makes it possible to restrain the growth of the gate bird's beak at a lower end of the third gate 109a and miniaturize the gate length of the third gate. In addition, it is also possible to reduce the threshold voltage variations of a MOS transistor formed by the third gate and restrain deviation of programming speed distribution among memory cells. This results in a decrease in the number of verifications at the time of chip programming and an increase in the programming throughput.

Further, the space formed at the time of third gate patterning is positioned within a memory mat in which a floating gate is positioned. Therefore, the step on which word line 117a is formed decreases. The lithography focus margin for word line patterning then improves, thereby making it possible to reduce the word line pitch.

A method for manufacturing the memory cells will now be described with reference to FIGS. 4 to 6 and FIGS. 16 to 18.

The nonvolatile semiconductor memory device comprises a memory cell region and a peripheral circuit region. In the memory cell region, a plurality of memory cells for information storage are arranged in matrix form. In the peripheral circuit region, a plurality of MOS transistors are mounted to form a peripheral circuit that provides necessary voltage generation within the chip. The peripheral circuit region can be divided into a low-voltage section to which only a voltage of 3.3 V or other relatively low voltage is applied, and a high-voltage section to which a voltage of 18 V or other high voltage required for reprogramming is applied. As shown in 6(e), the low-voltage section and high-voltage section both comprise a plurality of NMOS transistors and PMOS transistors, which are formed in P wells 104b and 104c and N wells 105a and 105b. Memory cells are formed in P well 104a. FIGS. 4 to 6 show a cross section that is parallel to memory cell word lines and perpendicular to peripheral circuit MOS transistor gate lines.

The manufacturing method will now be described.

First of all, a shallow groove isolation region 102 for isolating the select transistor and peripheral circuit MOS transistor is formed on a p-type Si substrate 101 having a plane orientation (100). P well regions 104a, 104b, and 104c, N well regions 105a and 105b, and an isolation region 103 are formed by an ion implantation method (FIGS. 4(*a*) and 16(*a*)). Next, channel ion implantation (not shown) is performed to adjust the threshold voltages for the memory cell, select transistor and peripheral circuit MOS transistor. Then, ion implantation is conducted to form a diffusion layer (124 in FIG. 2 and FIG. 16(*a*-2)) under a third gate bind (125 in FIG. 2). Thanks to the above ion implantation, the memory cell diffusion layer wiring 113 and select transistor diffusion layer 120a can be electrically connected (FIGS. 16 to 18). Next, an approximately 23 nm silicon oxide film 106, which serves as a high-voltage section gate dielectric film within the peripheral circuit region, is formed by thermal oxidation (FIG. 4(*b*) and FIG. 16(*b*)). Subsequently, a photoresist pattern is formed and then a wet etching method is applied to leave the silicon oxide film 106 in the high-voltage section of the peripheral circuit region (the silicon oxide film 106 is then designated by the reference numeral 106a) (FIG. 4(*c*) and FIG. 16(*c*)). Next, the photoresist pattern is removed, and then a 9 nm thermally oxidized film 108, which serves as a gate dielectric film for the select transistor and peripheral MOS transistor or a dielectric film for isolating the memory cell's third gate from the well, is formed by thermal oxidation in the low-voltage section of the peripheral circuit region and in the memory cell region. In this instance, the resulting thermally oxidized film thickness for the high-voltage section of the peripheral circuit region is 25 nm (the silicon oxide film 106a is then designated by the reference numeral 106b) (FIG. 4(*d*) and FIG. 16(*d*)). Subsequently, a polysilicon film 109 and a silicon oxide film 110, which serve as the electrodes for the select transistor and peripheral MOS transistor or memory cell third gate, are sequentially deposited (FIG. 4(*e*) and FIG. 16(*e*)). A lithography and dry etching technology are then used to pattern silicon oxide films 110 and polysilicon films 109 (the silicon oxide films 110 and polysilicon films 109 are then designated by the reference numerals 110a, 110b and 109a, 109b, respectively). The employed pattern arrangement scheme is such that the silicon oxide films 110 and polysilicon films 109 in all non-memory-cell regions remain without being etched. Further, all the spaces formed by the patterning process are of the same dimensions to ensure that the word line polycide to be formed in a later process is uniformly embedded in the third gate space within the chip and in flat stepped form (FIG. 4(*f*) and FIG. 16(*f*)).

Next, a silicon oxide film 111 is deposited d by low pressure CVD (Chemical Vapor Deposition) (FIG. 5(*a*) and FIG. 17(*a*)). This silicon oxide film 111 is then subjected to anisotropic etching so as to leave only the sidewall portion for the third gate pattern 109 (the silicon oxide film is then designated by the reference numeral 111a) (FIG. 5(*b*) and FIG. 17(*b*)). The film provides protection to prevent the third gate oxide film from receding in a cleaning process before tunnel dielectric film formation, thereby letting the gate bird's beak grow to increase programming variations among cells and degrade the short channel characteristic of the third gate MOS. The thickness of the silicon oxide film 111 is set so that the film is completely removed in a cleaning process performed immediately before tunnel dielectric film formation but the amount of overetching is extremely small. Subsequently, arsenic tilt ion implantation and boron tilt ion implantation are performed in different directions to form a memory cell source/drain region 113 and punch-through stopper layer 112 (FIG. 5(*c*)). The diffusion layer 124 under the third gate is now connected to the memory cell source/drain region 113 (FIG. 17(*c*)). Next, the dielectric film 114 for isolating the floating gate from the well and the floating gate from the third gate is formed by thermal oxidation. The oxide film over the well is set to a thickness of 9 nm. In this instance, an approximately 20 nm oxide film 114a grows on the third gate sidewall (FIG. 5(*d*) and FIG. 17(*d*)). A polysilicon film 115, which serves as a floating gate, is then deposited d in such a manner as to incompletely fill the third gate space (FIG. 5(*e*) and FIG. 17(*e*)). A lithography and dry etching technology are then used to pattern the deposited d film in a direction parallel to the third gate (the polysilicon 115 is then designated by the reference numeral 115a). The employed structure is such that an end of the floating gate pattern 115a is placed over the third gate 109a via the silicon oxide film 110a (FIG. 5(*f*)).

Subsequently, a film stack of a silicon oxide film/silicon nitride film/silicon oxide film for isolating a floating gate from a word line, that is, an ONO film 116, a stack film of a polysilicon film and a tungsten silicide film serving as a word line, that is, a polycide 117, and a silicon oxide film 118 are sequentially deposited. In this instance, the thickness of the polysilicon film serving as a lower layer for the polycide 117 is adjusted so as to completely fill the memory cell space formed as indicated in FIG. 4(*f*) and make the surface of the polycide 117 nearly flat (FIG. 6(*a*) and FIG. 18(*a*)). Next, a publicly known lithography and dry etching technology are used to pattern the silicon oxide film 118 and polycide 117 to the minimum dimensions to accomplish word line formation (the silicon oxide film 118 and polycide 117 are then designated by the reference numerals 118a and 117a, respectively). Further, the word line 117a is used as a mask to process the ONO film 116 and polysilicon film pattern 116a and finish the floating gate (the ONO film 116 and polysilicon film pattern 115a are then designated by the reference numerals 116a and 115b, respectively) (FIG. 6(*b*) and FIG. 18(*b*)). A lithography and drying etching technology are then used to pattern the silicon oxide film 110b and polysilicon film 109b in the peripheral circuit and form a gate electrode for the peripheral circuit MOS transistor (the silicon oxide film 110b and polysilicon film 109b are then designated by the reference numerals 110c and 109c, respectively) (FIG. 6(*c*)). The above process also forms a gate for the select transistor (127 in FIG. 2 and FIG. 18(*c*)). Further, at an end of the memory mat, the polysilicon film 109b and silicon oxide film 1110b are patterned outside the word line 117a as shown in FIG. 2. Next, the low-concentration source/drain regions 119a, 119b, 120a, 120b are formed for the select transistor and peripheral circuit MOS transistor by an ion implantation method (FIG. 6(*d*) and FIG. 18(*e*)), a sidewall 121 for the silicon oxide film is formed, and then the high-concentration source/drain regions 122a, 122b, 123a, 123b are formed for the peripheral circuit MOS transistor (FIG. 6(*e*)). This connects the diffusion layer 124 under the third gate, the source/drain region 113 for the memory cell, and the diffusion layer 120a, 123a for the select transistor so that the memory cell source/drain is connected to the diffusion layer for the select transistor (FIG. 18(*e*)). Subsequently, although not shown, an interlayer dielectric film is deposited and then contact hole (128 in FIG. 2) routed to a word line 117a, a gate electrode 127, 109c for the select transistor and peripheral MOS transistor, and the source/drain region 119a, 119b, 120a, 120b, 122a, 122b, 123a, 123b. A metal film is then deposited and processed to provide first layer metal wiring (129 in FIG. 2). Further, an interlayer dielectric film is formed and provided with a through-hole (130 in FIG. 2), and then second layer metal wiring (131 in FIG. 2) is formed to mainly provide a global bit line. In addition, an interlayer dielectric film is deposited and provided with a hole to form third layer metal wiring and then a passivation film to is formed to finish the nonvolatile semiconductor memory device.

Figure 10:
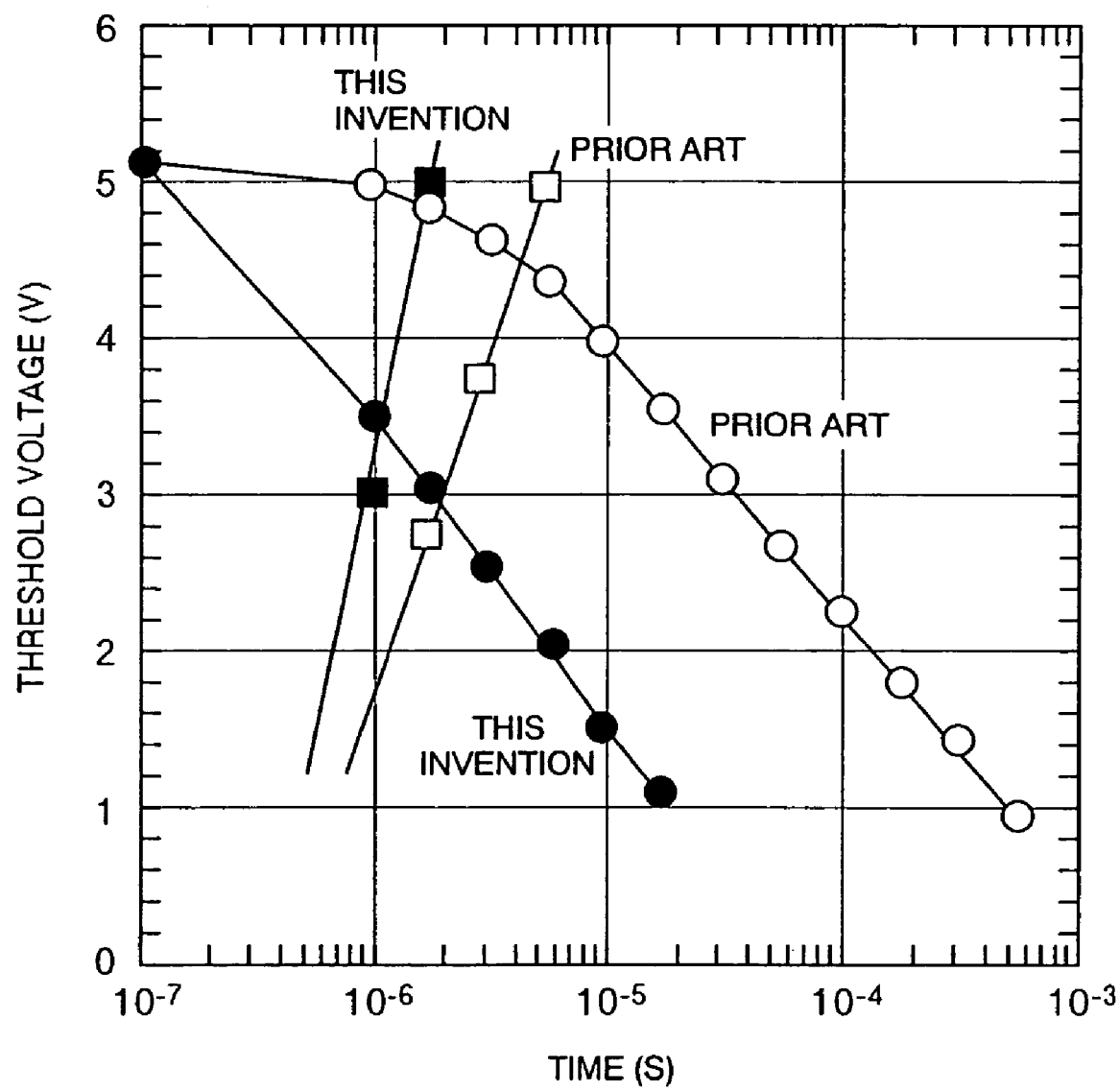
FIG. 10 illustrates threshold voltage changes that occur when the flash memory performs a programming/erasing operation.

FIG. 10 shows the programming/erasing characteristic of memory cells that are formed by the present invention. For comparison purposes, this figure also shows the characteristic of memory cells that are formed according to a method disclosed by Japanese Patent Laid-open No. 2001-85541. Fin-shaped floating gates are employed to decrease the cross-sectional area and reduce the capacity of the dielectric film between opposing floating gates. Further, the end of a floating gate is extended to the top of the third gate. Consequently, its surface area is increased to increase the coupling ratio from 0.52 to 0.60. As a result, the programming/erasing speed is increased even when the same voltage is used for programming/erasing.

Figure 11A:
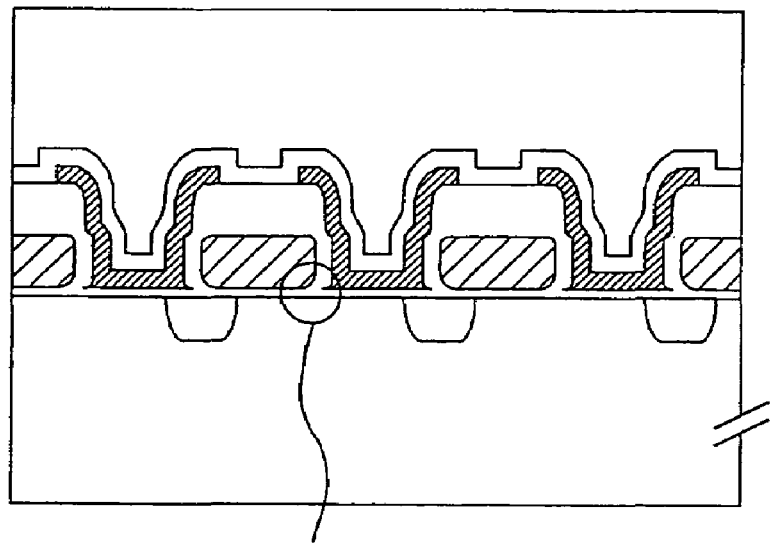
FIGS. 11(a) and 11(b) are cross-sectional views that illustrate the finish of the flash memory cell.
Figure 11B:
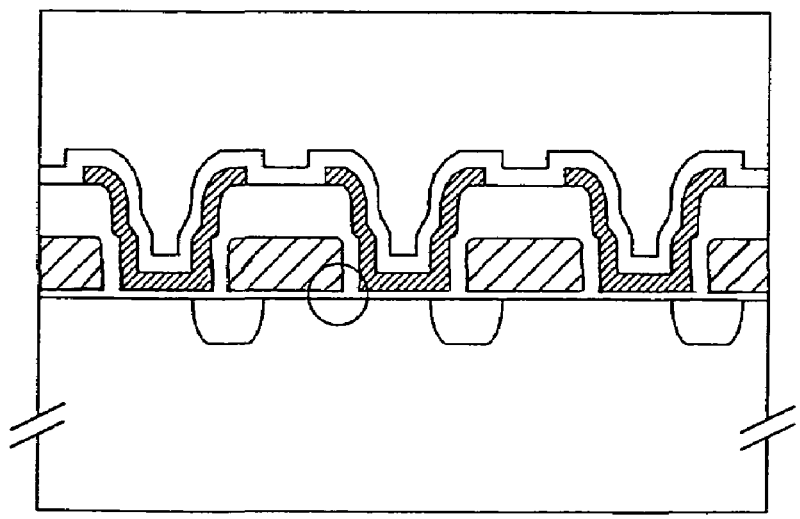

The result obtained by measuring the threshold voltage distribution after programming for memory cells formed by the above method indicates that the threshold voltage difference between the fastest bit and the slowest bit is 2.1 V. On the other hand, the programming threshold voltage distribution exhibited by the prior art that does not form a sidewall on the third gate is 4.7 V, which means that a great variation is involved. Further, the result obtained by measuring the cut-off characteristic under programming operating conditions for the split gate MOS transistor, which is composed by the third gate, indicates that the present invention can achieve cut-off even when the third gate length is 0.20 μm whereas the prior art allows a punch-through to occur when the third gate length is 0.25 μm and cannot readily accomplish cut-off. The SEM (Scanning Electron Microscope) observation of the cross-sectional shapes of the present invention and prior art, which has been made to clarify the difference in programming variations and cut-off characteristic between the present invention and prior art, has revealed that the prior art allows a gate bird's beak to grow at a lower end of the third gate as shown in FIG. 11(a), whereas the present invention restrains the growth of the gate bird's beak as shown in FIG. 11(b).

Further, the end of a memory cell array formed by the present invention has a significantly smaller number of word line open circuits/short circuits than the counterpart formed by the prior art. It means that the present invention increases the yield. The reason is that the third gate, which provides a base for a word line, is subjected to line-and-space patterning in the memory cell array section only. As a result, the contact hole region for connecting the word line to the metal wiring is positioned over the polysilicon film 109b and the silicon oxide film 110b deposited on the polysilicon film 109b so that the memory cell region is flush with the word line surface in the memory cell region. This increases the lithography focus margin for the word line to be patterned to the minimum dimensions, thereby enhancing the yield.

The first embodiment, which has been described above, provides an advantage of increasing the programming/erasing speed of a nonvolatile semiconductor memory device. Further, it provides an advantage of reducing the memory cell area. In addition, it also provides an advantage of increasing the yield.

Second Embodiment

A second embodiment of the present invention will now be described with reference to FIG. 12. The second embodiment differs from the first embodiment in that the formation of a third gate pattern 109a, and the formation of a memory cell diffusion layer 113, and the formation of a sidewall spacer 111a that take place in that order. The second embodiment's flash memory cell planar arrangement, finished cross-sectional structure, and array structure are the same as those of the first embodiment and will not be described herein.

The memory cell manufacturing method according to the second embodiment will now be described. First of all, a shallow groove isolation region 102, P well regions 104a, 104b, 104c, N well regions 105a, 105b, an isolation region between wells 103, gate dielectric films 106a, 108, and a polysilicon film 109a and a silicon oxide film 110a, which serve as the electrodes for the memory cell third gate, are formed on a silicon substrate. As is the case with the first embodiment, the employed pattern arrangement scheme is such that the silicon oxide films 110 and polysilicon films 109 in all non-memory-cell regions remain without being etched. Further, all the spaces formed by the patterning process are of the same dimensions (FIG. 12(a)).

Figure 12A:
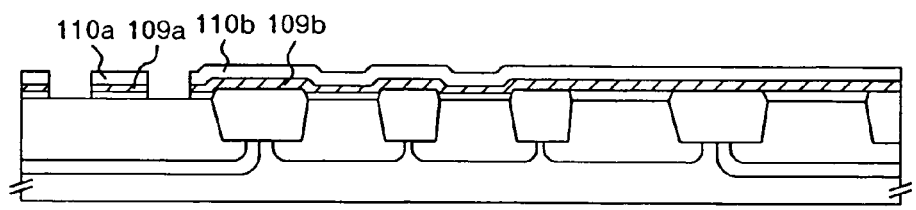
FIGS. 12(a) to 12(d) are cross-sectional views that illustrate a method for manufacturing a flash memory according to a second embodiment of the present invention.
Figure 12B:
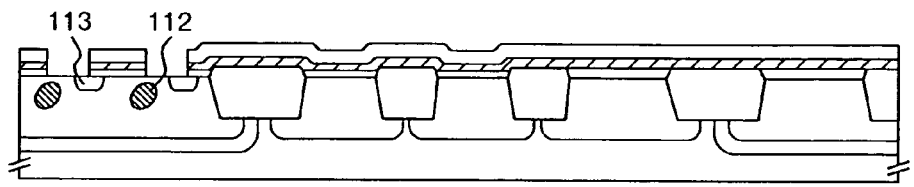
Figure 12C:
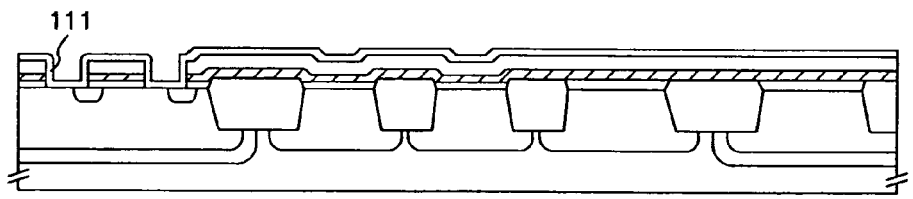
Figure 12D:
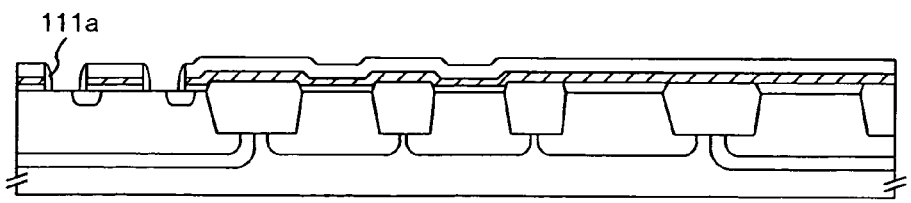

Next, arsenic tilt ion implantation and boron tilt ion implantation are performed in different directions to form a memory cell source/drain region 113 and punch-through stopper layer 112 (FIG. 12(b)). A silicon oxide film 111 is then deposited by low pressure CVD (Chemical Vapor Deposition) (FIG. 12(c)). This silicon oxide film 111 is then subjected to anisotropic etching so as to leave only the sidewall portion for the third gate pattern 109 (the silicon oxide film is then designated by the reference numeral 111a) (FIG. 12(d)). The film provides protection to prevent the third gate oxide film from receding in a cleaning process before tunnel dielectric film formation, thereby letting the gate bird's beak grow to increase programming variations among cells and degrade the short channel characteristic of the third gate MOS. As is the case with the first embodiment, the thickness of the silicon oxide film 111 is set so that the film is completely removed in a cleaning process performed immediately before tunnel dielectric film formation but the amount of overetching is extremely small.

Subsequently, the processes to be performed after the formation of the gate dielectric film 114 are performed in the same manner as described with reference to FIG. 5(d) to FIG. 6(e), which illustrate the first embodiment, to finish the memory cells (not shown).

As is the case with the first embodiment, the second embodiment of the present invention provides a higher programming/erasing speed than the prior art. It also reduces programming variations among memory cells and increases the chip programming throughput. Further, it improves the cut-off characteristic of the split gate MOS transistor, which is formed by the third gate, and makes it possible to decrease the third gate length. Furthermore, it enhances the yield.

Third Embodiment

A third embodiment of the present invention will now be described with reference to FIG. 13. The third embodiment differs from the second embodiment in that a tunnel dielectric film is formed without completely removing, in a cleaning process, a silicon oxide film sidewall that is formed on the third gate pattern 109.

The memory cell manufacturing method will now be described. After the same processing steps are performed to form a memory cell source/drain region 113 and channel stopper layer 112 as indicated in FIG. 12(b) and preceding figures illustrating the second embodiment (FIG. 13(a)), a silicon oxide film 111 is deposited by low pressure CVD (Chemical Vapor Deposition) (FIG. 13(b)) and subjected to anisotropic etching so as to leave only the sidewall portion for the third gate pattern 109 (the silicon oxide film is then designated by the reference numeral 111a) (FIG. 13(c)). The silicon oxide film is thicker than the counterpart used with the first or second embodiment. Further, provision is made so that the silicon oxide film is not removed in a cleaning process that is performed immediately before tunnel dielectric film formation. The silicon oxide film 11a not only provides protection at the time of tunnel dielectric film formation, as is the case with the first and second embodiments, to inhibit the gate bird's beak from growing to increase programming variations among cells and the short channel characteristic of the third gate MOS from being degraded, but also functions as a dielectric film that isolates the third gate 109a from the floating gate 115b.

Figure 5A:
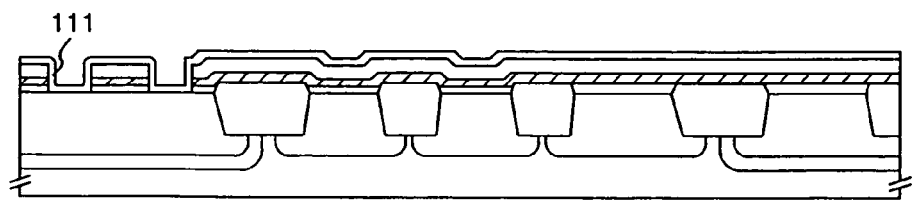
FIGS. 5(a) to 5(f) are cross-sectional views that illustrate a method for manufacturing the flash memory.
Figure 5B:
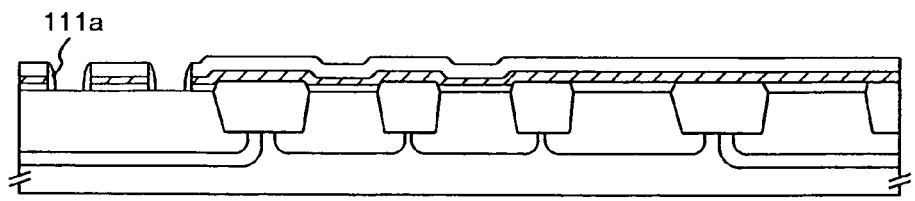
Figure 5C:
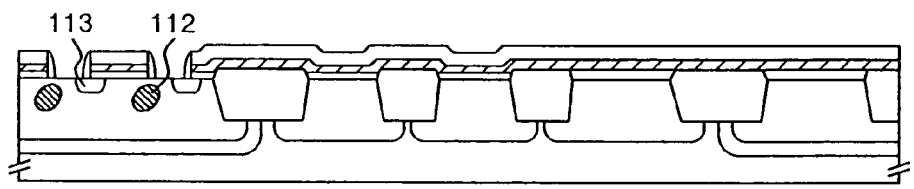
Figure 5D:
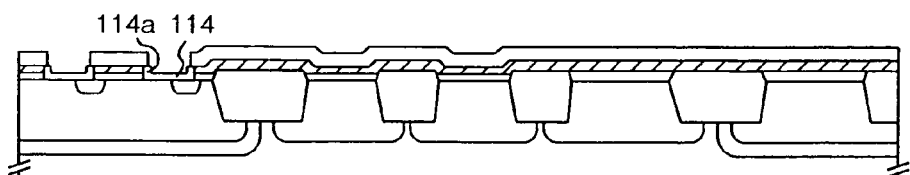
Figure 5E:
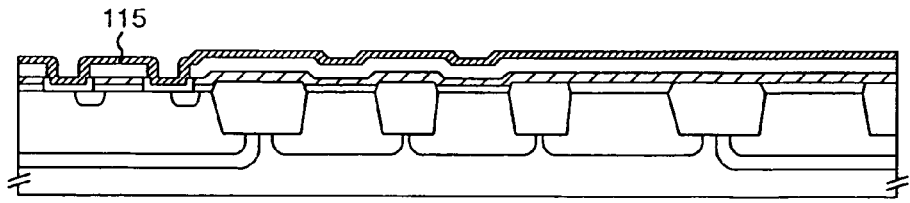
Figure 5F:
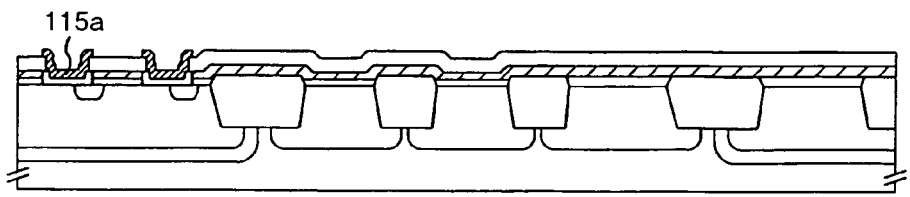
Figure 13A:
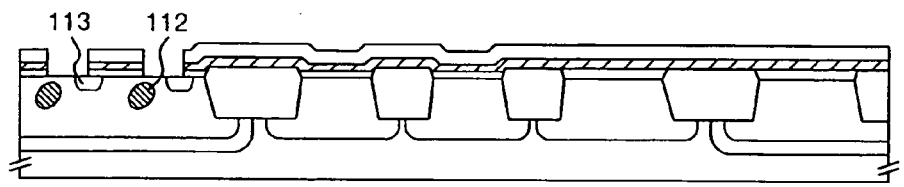
FIGS. 13(a) to 13(d) are cross-sectional views that illustrate a method for manufacturing a flash memory according to a third embodiment of the present invention.
Figure 13B:
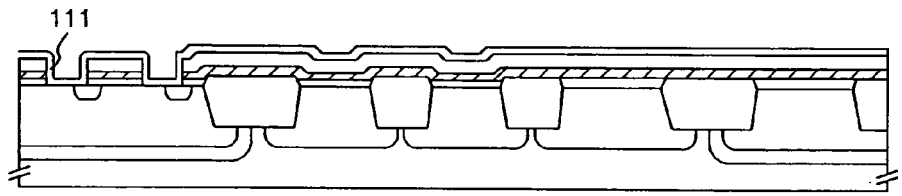
Figure 13C:
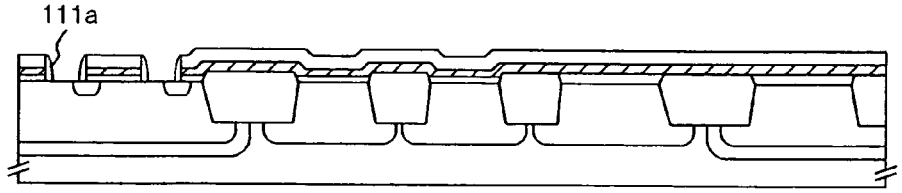
Figure 13D:
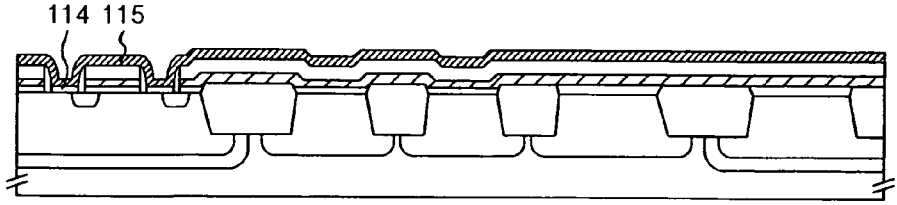

After a tunnel dielectric film 114 and a polysilicon film 115, which serves as a floating gate, are formed (FIG. 13(d)), the same processing steps are performed to finish the memory cells (not shown) as indicated in FIG. 5(f) and subsequent figures illustrating the first embodiment.

As is the case with the first and second embodiments, the third embodiment of the present invention provides a higher programming/erasing speed than the prior art. It also reduces programming variations among memory cells and increases the chip programming throughput. Further, it improves the cut-off characteristic of the split gate MOS transistor, which is formed by the third gate, and makes it possible to decrease the third gate length. Furthermore, it enhances the yield.

As is the case with the second embodiment, the third embodiment forms a silicon film sidewall 11a after a memory cell source/drain diffusion layer 113 is formed. However, the same effect is produced even when the silicon oxide film sidewall 111a is formed before the formation of the source/drain diffusion layer 113 as is the case with the first embodiment.

In the above embodiment, a fin-shaped floating gate is employed and placed over a third gate to increase the coupling ratio with a view toward programming/erasing characteristic improvement. However, even if a floating gate is embedded between third gates as disclosed by Japanese Patent Laid-open No.2001-28428 and Japanese Patent Laid-open No.2001-85541, a silicon oxide film sidewall can be formed on a third gate to restrain the growth of a bird's beak at a lower end of the third gate, reduce programming variations among memory cells, and enhance the chip programming throughput. Further, the cut-off characteristic of the split gate MOS transistor formed by the third gate can be improved to reduce the third gate length. Furthermore, when a flat pattern is employed in a non-memory-cell region for a third gate on which a word line is based, the step decreases, thereby increasing the lithography focus margin. This results in a remarkable decrease in the number of word line open circuits/short circuits at an end of the mat, thereby making it possible to increase the yield.

In the above embodiment, an erasing operation is performed by applying a negative bias to the word line, setting the other terminals to 0 V, and emitting electrons accumulated in the floating gate to the well. However, the same effect is produced even when an erasing operation is performed by applying a negative bias to the word line and a positive bias to the third gate, setting the other terminals to 0 V, and emitting electrons from the floating gate to the third gate.

In all the foregoing embodiments, at least two states are required for electrons accumulated in a floating gate at the time of programming. However, the embodiments can be applied to multilevel storage in which four or more state levels are formed so that a single memory cell stores two or more bits of data. In conventional multilevel storage, the difference between the lowest threshold voltage state and the highest threshold voltage state is greater than in two-level storage even when the amount of electrons accumulated in a floating gate is controlled with high precision to compress the threshold voltage distribution of each level. Therefore, when Fowler-Nordheim programming is performed, a problem arises so that the programming speed decreases or the programming voltage increases. The present invention, on the other hand, can reduce the voltage for programming/erasing to as low as 13 V or so. In other words, the present invention can raise the programming speed and is therefore extremely effective for multilevel storage.

While the present invention has been described in terms of the foregoing preferred embodiments, it should be understood that the present invention is not limited to those preferred embodiments, and that variations may be made without departure from the scope and spirit of the present invention. For example, the present invention can be applied to a one-chip microcomputer (semiconductor device) that comprises a memory cell array having a nonvolatile semiconductor memory device.

The representative embodiments of the present invention provide the following advantages:

Reduces the memory cell area of a nonvolatile semiconductor memory device.

Increases the operating speed of a nonvolatile semiconductor memory device.

Enhances the yield of a nonvolatile semiconductor memory device.

What is claimed is:

1. A non-volatile semiconductor memory device comprising:
   a first pattern portion provided above a semiconductor substrate as a charge storage region;
   a second pattern portion provided above the semiconductor substrate to one side of the first pattern portion; and
   a third pattern portion provided above the semiconductor substrate to another side of the first pattern portion,
   wherein the first pattern portion is formed so as to cover a lateral surface of the second pattern portion and a lateral surface of the third pattern portion,
   wherein one end of the first pattern portion is positioned on an upper surface of the second pattern portion,
   wherein another end of the first pattern portion is positioned on an upper surface of the third pattern portion,
   wherein the first pattern portion is positioned in a gap region between the second pattern portion and the third pattern portion, a part of the first pattern portion being concave, and
   wherein the first pattern portion satisfies the relationship A>B+C+D, where a sidewall area of the first pattern portion within the gap region is A, a bottom surface area of the first pattern portion within the gap region is B, an upper surface area of a part of the first pattern portion over a top of second pattern portion is C, and a side wall area of the part of the first pattern portion over the top of the second pattern portion is D.

2. The non-volatile semiconductor memory device according to claim 1, further comprising:
   a source region and a drain region disposed on a main surface of the semiconductor substrate; and a channel region formed between the source region and the drain region, wherein the first pattern portion is formed above the channel region on a side toward the drain region via a first gate dielectric film, wherein the second pattern portion is formed above the channel region on a side toward the source region via a second gate dielectric film, wherein a lateral surface portion of the second pattern portion is covered with a first dielectric film, and wherein the second pattern portion has a gate portion and a second dielectric film covering an upper surface of the gate portion.

3. The non-volatile semiconductor memory device according to claim 2, wherein the gate portion controls the channel region on the side toward the source region via the second gate dielectric film.

4. The non-volatile semiconductor memory device according to claim 3, wherein the gate portion has a gate function as an erase gate.

5. The non-volatile semiconductor memory device according to claim 2, wherein the second gate dielectric film is formed from a same film as a gate dielectric film for a MOS transistor for a low-voltage section of a peripheral circuit formed on the semiconductor substrate.

6. The non-volatile semiconductor memory device according to claim 2, wherein a material and a film thickness of the gate portion are the same as those of a gate for a MOS transistor for a peripheral circuit formed on the semiconductor substrate.

7. A non-volatile semiconductor memory device, comprising:
　　a source region and a drain region disposed on a main surface of a semiconductor substrate;
　　a channel region formed between said source region and said drain region;
　　a first gate provided above said channel region on a side toward said drain region and via a first gate dielectric film;
　　a second gate provided above said channel region on a side toward said source region via a second gate dielectric film;
　　a third gate provided via a third dielectric film formed on said first gate;
　　a word line electrically connected to said third gate;
　　a contact hole formed on said word line; and
　　metal wiring that is connected to said word line via said contact hole,
　　wherein said contact hole is provided above a member having a same material and a same film thickness as a film that forms said second gate.

8. The non-volatile semiconductor memory device according to claim 7, wherein the member is a polysilicon film.

9. The non-volatile semiconductor memory device according to claim 7, wherein a lateral surface of said second gate is covered with a first dielectric film, and an upper surface of the second gate is provided with a second dielectric film.

* * * * *